(12) United States Patent
Jung et al.

(10) Patent No.: US 6,866,984 B2
(45) Date of Patent: *Mar. 15, 2005

(54) ARF PHOTORESIST COPOLYMERS

(75) Inventors: Jae Chang Jung, Kyoungki-do (KR); Cheol Kyu Bok, Seoul (KR); Ki Ho Baik, Gyunggi-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/740,962

(22) Filed: Dec. 18, 2003

(65) Prior Publication Data

US 2004/0131968 A1 Jul. 8, 2004

Related U.S. Application Data

(63) Continuation of application No. 09/605,206, filed on Jun. 27, 2000, now Pat. No. 6,808,859, which is a continuation-in-part of application No. 09/000,984, filed on Dec. 30, 1997, now Pat. No. 6,132,926.

(30) Foreign Application Priority Data

Dec. 31, 1996 (KR) ............................................. 96-80264
Jun. 21, 1997 (KR) ............................................. 97-26807

(51) Int. Cl.$^7$ ............................................ G03F 7/004
(52) U.S. Cl. ................................. 430/270.1; 430/281.1; 430/286.1; 430/320; 526/269; 526/272; 526/281
(58) Field of Search .............................. 430/320, 270.1, 430/281.1, 286.1; 526/269, 272, 281

(56) References Cited

U.S. PATENT DOCUMENTS

| | | |
|---|---|---|
| 3,715,330 A | 2/1973 | Nogami et al. |
| 4,011,386 A | 3/1977 | Matsumoto et al. |
| 4,106,943 A | 8/1978 | Ikeda et al. |
| 4,491,628 A | 1/1985 | Ito et al. |
| 4,883,740 A | 11/1989 | Schwalm et al. |
| 5,087,677 A | 2/1992 | Brekner et al. |
| 5,212,043 A | 5/1993 | Yamamoto et al. |
| 5,252,427 A | 10/1993 | Bauer et al. |
| 5,278,214 A | 1/1994 | Moriya et al. |
| 5,585,219 A | 12/1996 | Kaimoto et al. |
| 6,013,413 A | 1/2000 | Frechet et al. |
| 6,017,676 A | 1/2000 | Jung et al. |
| 6,028,153 A | 2/2000 | Jung |
| 6,045,967 A | 4/2000 | Jung et al. |
| 6,103,445 A | 8/2000 | Willson et al. |
| 6,103,450 A | 8/2000 | Choi |
| 6,103,845 A | 8/2000 | Choi et al. |
| 6,114,084 A | 9/2000 | Kang et al. |
| 6,124,074 A | 9/2000 | Varanasi et al. |
| 6,132,926 A | 10/2000 | Jung et al. |
| 6,136,499 A | 10/2000 | Goodall et al. |
| 6,143,465 A | 11/2000 | Choi |
| 6,143,466 A | 11/2000 | Choi |
| 6,150,069 A | 11/2000 | Jung et al. |
| 6,165,672 A | 12/2000 | Jung et al. |
| 6,171,754 B1 | 1/2001 | Choi et al. |
| 6,180,316 B1 | 1/2001 | Kajita et al. |
| 6,225,020 B1 | 5/2001 | Jung et al. |
| 6,235,447 B1 | 5/2001 | Lee et al. |
| 6,245,485 B1 | 6/2001 | Aoai et al. |
| 6,248,847 B1 | 6/2001 | Jung et al. |
| 6,251,560 B1 | 6/2001 | Wallow et al. |
| 6,265,130 B1 | 7/2001 | Lee et al. |
| 6,270,942 B1 | 8/2001 | Choi |
| 6,280,903 B1 | 8/2001 | Kang et al. |
| 6,291,131 B1 | 9/2001 | Jung et al. |
| 6,312,865 B1 | 11/2001 | Jung et al. |
| 6,312,868 B1 | 11/2001 | Kong et al. |
| 6,316,162 B1 | 11/2001 | Jung et al. |
| 6,316,565 B1 | 11/2001 | Jung et al. |
| 6,322,948 B1 | 11/2001 | Jung et al. |
| 6,348,296 B1 | 2/2002 | Jung et al. |
| 6,391,518 B1 | 5/2002 | Jung et al. |
| 6,416,926 B1 | 7/2002 | Jung et al. |
| 6,426,171 B1 | 7/2002 | Jung et al. |
| 6,448,352 B1 | 9/2002 | Jung et al. |

FOREIGN PATENT DOCUMENTS

| | | |
|---|---|---|
| EP | 794458 | 9/1997 |
| EP | 0836119 A1 | 11/1997 |
| GB | 1329997 | 9/1970 |
| NL | 128164 | 2/1977 |
| WO | WO 96/37526 | 11/1996 |
| WO | WO 97/33198 | 9/1997 |

OTHER PUBLICATIONS

Uzodinma Okoroanyanwu et al., "New Single Layer Positive Photoresists for 193 nm Photolithography," SPIE, vol. 3049, 1997, pp. 92–103.

D. Braun et al., "Über Die Copolymerisation Von Maleinsäure–Anhydrid Mit Bicyclo[2.2.1] Hept–5–En–2–Carbonsäure," Eur. Polym. J., vol. 10, 1974, pp. 357–365.

CA vol. 66 (1967), 76325, pp. 7178–7179.

Jung et al., "Synthesis and Characterization of Alicyclic Polymers with Hydrophilic Groups for 193 nm Single Layer Resist," 1999, CA Abstract 130:229879.

CA Register No. 100207–98–5.
CA Register No. 32759–57–2.
CA Register No. 27056–70–8.
CA Register No. 174659–58–6.

(List continued on next page.)

Primary Examiner—Barbara L. Gilliam
(74) Attorney, Agent, or Firm—Townsend and Townsend and Crew LLP

(57) ABSTRACT

A photoresist copolymer is prepared from one or more carboxy-substituted bicycloalkene monomers, and this copolymer is used to prepare a photoresist for submicrolithography processes employing deep ultraviolet (ArF) as a light source. In addition to having high etch resistance and thermal resistance, the photoresist has good adhesiveness to the substrate and can be developed in a TMAH solution.

10 Claims, No Drawings

OTHER PUBLICATIONS

CA Register No. 28503–41–5.

CA Register No. 94997–59–6.

CA Abstract No. 104:149512 & Macromolecules 19(4) 1266–8 (1986).

CA Abstract No. 91:124064 & Makromol. Chem. 180(8) 1975–88 (1979).

CA Abstract No. 113:24734 & JP 02 051511.

CA Abstract No. 124:317926 & Marcomol. Rapid Commun. 17(3) 173–180 (1996).

CA Abstract No. 124:203171 & Macromolecules 29(8) 2755–63 (1996).

CA Abstract No. 199328–07–9.

T.I. Wallow et al., "Evaluation of Cycloolefin–Maleic Anhydride Alternating Copolymers as Single–Layer Photo–Resists for 193 nm Photo–Lithography," SPIE, vol. 2724, pp. 355–364.

CA Abstract 127:227308 & Proc. SPIE–Int. Soc. Opt. Eng. (1997) 3049 Advances in Resist Technology and Processing XIV 92–103.

CA Abstract 127:227269 & J. Photopolym. Sci. Technol. (1997) 10 (4) 529–534.

CA Abstract 66:18889 & Magy. Kem. Foly. (1966) 72 (11) 491–3.

R.D. Allen et al., "The Influence of Photoacid Structure on the Design and Performance of 193nm Resists," 1997, Journal of Photopolymer Science and Technology, vol. 10, pp. 503–510.

F.M. Houlihan et al., "A Commerically Viable 193nm Single Layer Resist Platform," 1997, Journal of Photopolymer Science and Technology, vol. 10, pp. 511–520.

J.C. Jung et al., "ArF Single Layer Resist Composed of Alicyclic Main Chain Containing Maleic Anhydride," 1997 Journal of Photopolymer Science and Technology, vol. 10, pp. 529–533.

S.J. Choi et al., "New ArF Single–layer Resist for 193–nm Lithography," 1997, Journal of Photopolymer Science and Technology, vol. 10, pp. 521–528.

T. Hattori et al., "Synthesis and Dissolution Characteristics of Novel Alicyclic Polymer With Monoacid Ester Structures," 1997, Journal of Photopolymer Science and Technology, vol. 10, pp. 535–544.

K. Nozaki et al., "New Protective Groups in Methacrylate Polymer for 193–nm Resists," 1997, Journal of Photopolymer Science and Technology, vol. 10, pp. 545–550.

K. Nakano et al., "Chemically Amplified Resist Based on High Etch–Resistant Polymer for 193–nm Lithography," 1997, Journal of Photopolymer Science and Technology, vol. 10, pp. 561–569.

ARF PHOTORESIST COPOLYMERS

CROSS-REFERENCES TO RELATED APPLICATIONS

This is a continuation of application Ser. No. 09/605,206, filed Jun. 27, 2000 now U.S., Pat. No. 6,808,859, which in turn is a continuation-in-part of application Ser. No. 09/000,984, filed Dec. 30, 1997, now U.S. Pat. No. 6,132,926, all of which claim priority from South Korean Patent Application No. 96-80264, filed Dec. 31, 1996 and South Korean Patent Application No. 97-26807, filed Jun. 21, 1997, and all of which are hereby incorporated herein by reference.

BACKGROUND OF THE INVENTION

1. Field of the Invention

The present invention relates to the fabricating of an integrated circuit. More particularly, the invention provides an ArF photoresist resin and a preparation method therefor and, more particularly, to a photoresist copolymer suitable for submicrolithography using deep ultra violet (DUV) light as a light source and a method for preparing such a copolymer. Also, the present invention provides a photoresist composition ("photoresist") including such a resin.

2. Description of the Prior Art

Recently, chemical amplification photoresists have been prevailing in semiconductor devices since they have been found to be highly sensitive to DUV light, which is recognized as a light source suitable for accomplishing the high integration of semiconductor devices. A chemical amplification photoresist generally has a photoacid generator and a matrix polymer having a chemical structure which sensitively reacts with acid.

As for the reaction mechanism of such a photoresist, when the photoresist is exposed through a mask to a DUV light source, protons are generated by the action of the photoacid generator, which then reacts with the main or side chain of the matrix polymer. This reaction increases the solubility of the copolymer in a developing solution by converting the structure of the copolymer, e.g., by decomposing it, cross-linking it or changing its polarity. Therefore, when treated with the developing solution, the copolymer is dissolved at exposed regions and remains undissolved at un-exposed regions, thereby leaving the shape of the mask as a positive image on a substrate.

Meanwhile the resolution of the patterns formed by photolithography is generally proportional to the wavelength of the light source. Thus, finer patterns can be formed as the wavelength is shorter. As a result of the effort to find new light sources suitable to improve the resolution, deep UV (DUV) light was developed for the integration of semiconductor devices into 1 Giga or higher scale.

Generally, photoresists are required to be of high etch resistance and thermal resistance. In addition, the photoresist to be used for an ArF (193 nm wavelength) light source should be developed in a 2.38% tetramethylammonium hydroxide (TMAH) solution. However, in fact, it is difficult to obtain a photoresist resin which satisfies those properties entirely.

For example, resins having a backbone of poly (methylmethacrylate), which is transparent to light of the above short wavelengths, are easy to synthesize. But there are problems in practical application owing to their poor etch resistance and development in TMAH solution. Etch resistance can be improved by introducing aliphatic ring monomers into the main chain. But it is virtually impossible to synthesize a resin having a main chain consisting of aliphatic rings.

In order to solve the problems, people such as those at AT&T (or Bell Laboratory) has developed a resin having a main chain which comprises norbornene, acrylate and maleic anhydride monomers, as represented by the following formula I:

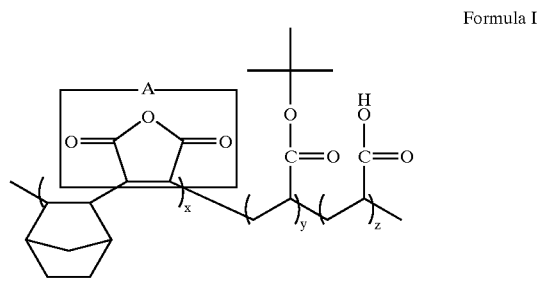

Formula I

In Formula I, the maleic anhydride (part A) is used to polymerize aliphatic cyclo-olefin groups, but is dissolved in a 2.38% TMAH solution even in the state of unexposure. This dissolution can be inhibited by increasing the proportion of the y part of Formula I, the t-butyl substituent, in the main chain. If this is done, the z part, functioning to increase the adhesiveness to a substrate becomes relatively small in proportion, which leads to the release of the photoresist from the substrate, e.g. a silicon wafer. As a result, the formation of good patterns is impossible by this method. Bell Laboratory suggested a two-component system including a cholesterol compound as a dissolution inhibitor. This dissolution inhibitor is, however, required to be added in a large quantity, for example, about 30% by weight of the resin, so that Bell Laboratory's resins are in principle problematic for use in a photoresist.

SUMMARY OF THE INVENTION

Therefore, it is an object of the present invention to overcome the above problems encountered in prior art and to provide an ArF photoresist resin which is dissolved only slightly in developing solutions without a chemical change in its structure in addition to being superior in etch resistance, thermal resistance and adhesiveness.

It is an object of the present invention to provide a photoresist copolymer.

It is another object of the present invention to provide a method for preparing the photoresist copolymer.

It is a further object of the present invention to provide a photoresist comprising the photoresist copolymer.

It is still another object of the present invention to provide a method for fabricating the photoresist.

It is still another object of the present invention to provide a method for fabricating an integrated circuit device.

It is still another object of the present invention to provide a partially complete semiconductor device.

DETAILED DESCRIPTION OF THE INVENTION

The novel photoresist copolymers of the present invention comprise repeating units in the backbone of the polymer derived from one or more carboxy-substituted bicycloalkene monomers of the following Formula II:

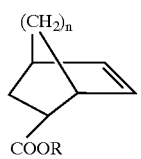

Formula II wherein, R represents hydrogen or a straight or branched alkyl group containing 1–10 substituted or non-substituted carbon atoms, R of one of said bicycloalkenes being hydroxyalkyl; and n is 1 or 2. As shown in Formula II, the monomers of the present invention are polymerized through the double bond in the bicycloalkene ring.

In Formula II, preferred R groups are hydrogen, 2-hydroxyethyl and t-butyl. That is, preferred examples of the bicyclocalkene monomers include 2-hydroxethyl 5-norbornene-2-carboxylate, t-butyl 5-norbornene-2-carboxylate, 5-norbornene 2-carboxylic acid, 2-hydroxyethyl bicyclo [2,2,2] oct-5-ene-2-carboxylate, t-butyl bicyclo [2,2,2] oct-5-ene-2-carboxylate and/or bicyclo [2,2,2] oct-5-ene-2-carboxylic acid.

The copolymer of the invention has a molecular weight ranging from approximately 3,000 to 100,000.

Preferred polymers of Formula II comprise at least two carboxy-substituted bicycloalkene monomers and are represented by the following Formula IIA:

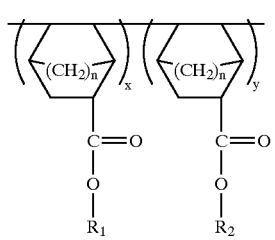

Formula IIa wherein $R_1$ is hydroxyalkyl; $R_2$ is hydrogen or alkyl; n is 1 or 2; and x and y represent the relative amounts of each monomer. Preferably, for every monomer represented by x, there are two monomers represented by y, wherein $R_2$ is hydrogen in one of said y monomers and $R_2$ is t-butyl in the other y monomer.

Hydroxyalkyl groups represented by $R_1$ in Formula IIA may have from 1 to 10 carbon atoms, preferably from 1 to 6 carbon atoms, and most preferably from 1 to 4 carbon atoms. Examples of preferred hydroxalkly groups are 2-hydroxyethyl, 2-hydroxy propyl, 3-hydroxy propyl, 2-hydroxy butyl, 3-hydroxy butyl, 4-hydroxy butyl and 2-methyl-3-hydroxy propyl.

Alkyl groups represented by $R_2$ in Formula IIA are preferably blocking or protective groups that are clearable by acid generated by the photoacid generator used in the photoresist composition. A preferred alkyl group is t-butyl.

The copolymers of the present invention may be prepared by polymerization with only the alicyclic compounds represented by Formula II using known polymerization methods, for example using a metal catalyst system as described in Goodall et al, International Publication Number WO 96/37526. However, the preferred polymerization method for the practice of the present invention is to incorporate one or more additional monomers (hereinafter referred to as the polymerization-enhancing comonomers) to increase the yield of copolymer. The most preferred polymerization-enhancing comonomers are maleic anhydride, having the following Formula III:

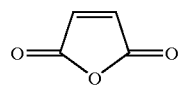

Formula III and/or vinylene carbonate of the following Formula IV:

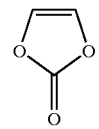

Formula IV

One of the preferred copolymers of the invention is prepared from vinylene carbonate and three bicycloalkenes wherein R in Formula II is hydrogen, 2-hydroxy ethyl and t-butyl, respectively, and n is 1. That is, in a preferred embodiment the three bicycloalkene monomers are 2-hydroxyethyl 5-norbornene-2-carboxylate, t-butyl 5-norbornene-2-carboxylate and 5-norbornene 2-carboxylic acid.

Preferred copolymers of the present invention may be prepared according to ordinary radical polymerization techniques using radical polymerization initiators in bulk polymerization or in solution polymerization processes. For the polymerization solvent, cyclohexanone, methylethylketone, benzene, toluene, dioxane, dimethylformamide, and tetrahydrofuran alone, or combinations thereof, may be used. Usually, the polymerization is carried out in the presence of a polymerization initiator, such as benzoylperoxide, 2,2'-azobisisobutyronitrile (AIBN), actyl peroxide, lauryl peroxide and t-butylperacetate.

A positive photoresist composition useful for forming positive fine patterns in semiconductor devices may be obtained by mixing the novel photoresist copolymer of the invention with a photoacid generator in an organic solvent in a typical manner. The amount of the copolymer is dependent on the organic solvent, the photoacid generator and the lithography conditions, and is preferably about 10–30% by weight of the organic solvent used.

As an example of a method of fabricating a photoresist, the copolymer of the invention is first dissolved in cyclohexanone at an amount of 10–30% by weight and an onium salt or organic sulfonic acid, as a photoacid generator, is added at an amount of about 0.1–10% by weight of the photoresist polymer. Then, this solution is filtered with an ultrafine filter to yield a photoresist solution.

This photoresist solution is spin-coated on a silicon wafer and is, then, soft-baked at a temperature of 80–150° C. for 1–5 min. in an oven or on a hot plate. An exposure process is carried out by use of a stepper which employs DUV light or excimer laser as a light source. Thereafter, the wafer is subjected to post-baking at a temperature of 100–200° C. An ultrafine positive resist image can be obtained by immersing the post-baked wafer for 90 seconds in a 2.38% TMAH solution.

A better understanding of the present invention may be obtained in light of following examples which are set forth to illustrate, but are not to be construed to limit, the present invention.

EXAMPLE I

Synthesis of 2-hydroxyethyl 5-norbornene-2-carboxylate

Dicyclopentadiene of the following formula V was cracked at about 120–170° C., thereby obtaining cyclopentadiene of the following Formula VI.

Formula V

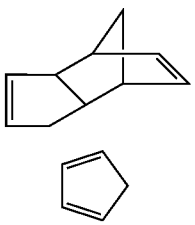

Formula VI

Cyclopentadiene of Formula VI and 2-hydroxyethylacrylate of the following Formula VII are dissolved at the same rate in ether or tetrahydrofuran and reacted at a temperature of about −30 to 60° C. for 24 hours. Thereafter, the solvent is removed by use of a rotary evaporator and the residue is distilled in vacuo to give 2-hydroxyethyl 5-norbornene-2-carboxylate of the following Formula VIII, which occurs in an endo- and exo-mixture.

Formula VII $$\begin{array}{c} \text{CH}_2 \\ \| \\ \text{C}=\text{O} \\ | \\ \text{O} \\ | \\ \text{CH}_2 \\ | \\ \text{CH}_2 \\ | \\ \text{O} \\ | \\ \text{H} \end{array}$$

Formula VIII

[Structure of 2-hydroxyethyl 5-norbornene-2-carboxylate]

EXAMPLE II

Synthesis of t-butyl 5-norbornene-2-carboxylate 66 g of cyclopentadiene is first put in a reactor and then mixed with 500 g of tetrahydrofuran. 128 g of t-butyl acrylate is added to the reactor. Thereafter, these reactants are subjected to a reaction at a temperature of −30 to 60° C. for 10 hrs with stirring. After the completion of the reaction, the solvent is vaporized in vacuo by use of a rotary evaporator, then vacuum distilled to produce the subject compound: yield is 90%.

EXAMPLE III

Synthesis of Copolymer 91 g of the 2-hydroxyethyl 5-norbornene-2-carboxylate synthesized in Example I, 97 g of the t-butyl 5-norbornene-2-carboxylate synthesized in Example II, and 86 g of vinylene carbonate are put into a reactor and 182 g of tetrahydrofuran solvent is poured thereto. Then, 5.48 g of azobisisobutyronitrile (AIBN) is added into the reactor. Then, the reactor is purged with a nitrogen atmosphere. A reaction is performed for 6 hrs. at 65–120° C. After the completion of the reaction, a part of the solvent is removed by a rotary evaporator and the residue is precipitated in ethyl ether. The precipitate is filtered and dried in a vacuum oven. The resulting product can be used as a photoresist resin.

EXAMPLE IV

Synthesis of Copolymer 91 g of the 2-hydroxyethyl 5-norbornene-2-carboxylate synthesized in Example I, 97 g of the t-butyl 5-norbornene-2-carboxylate synthesized in Example II, and 98 g of maleic anhydride are put in a reactor and 190 g of tetrahydrofuran solvent is poured thereto. Then, 5.72 g of azobisisobutyronitrile (AIBN) is added into the reactor. Then, the reactor is purged with a nitrogen atmosphere. A reaction is performed for 6 hrs. at 65–120° C. After the completion of the reaction, a part of the solvent is removed by a rotary evaporator and the residue is precipitated in ethyl ether. The precipitate is filtered and dried in a vacuum oven. The resulting product can be used as a photoresist resin.

EXAMPLE V

Synthesis of Copolymer 98 g of 2-hydroxyethyl bicyclo [2,2,2] oct-5-ene-2-carboxylate, 104 g of t-butyl bicyclo [2,2,2] oct-5-ene-2-carboxylate and 86 g of vinylene carbonate are put into a reactor and then, mixed with 2 L of tetrahydrofuran solvent. Thereafter, 1.5 g of azobisisobutyronitrile (AIBN) is put into the reactor and then the reactor is purged with a nitrogen atmosphere. A reaction is performed for 6 hrs. at 65° C. After the completion of the reaction, a part of the solvent is removed by a rotary evaporator and the residue is precipitated in ethyl ether. The precipitate is filtered and dried in a vacuum oven. The resulting product can be used as a photoresist resin.

EXAMPLE VI

Synthesis of Copolymer 98 g of 2-hydroxyethyl bicyclo [2,2,2] oct-5-ene-2-carboxylate, 104 g of t-butyl bicyclo [2,2,2] oct-5-ene-2-carboxylate and 86 g of 98 g of maleic anhydride are put into a reactor and then, mixed with 2 L of tetrahydrofuran solvent. Thereafter 1.5 g of azobisisobutyronitrile (AIBN) is put into the reactor and then, the reactor is purged with a nitrogen atmosphere. A reaction is performed for 6 hrs. at 65° C. After the completion of the reaction, a part of the solvent is removed by a rotary evaporator and the residue is precipitated in ethyl ether. The precipitate is filtered and dried in a vacuum oven. The resulting product can be used as a photoresist resin.

EXAMPLE VII

Synthesis of Copolymer Using Metal Catalyst

It is contemplated that the copolymers of Examples III-VI above may be polymerized without maleic anhydride or vinylene carbonate monomers, for example by using the allylpalladium chloride dimer/silver hexafluoroantimonate catalyst system described in Goodall et al. International Publication WO 96/37526. In accordance with, for example, Example 30 of Goodall et al., 37.5 mmol of t-butyl 5-norbornene-2-carboxylate and 12.5 mmol of 2-hydroxyethyl 5-norbornene-2-carboxylate and 50 mol of freshly distilled dichloroethane are added to a 50 ml glass vial equipped with a Teflon® coated stir bar and the solution is degassed under argon atmosphere. A 10 ml glass vial equipped with a Teflon® coated stir bar is charged with 0.0365 g (0.1 mmol) of allylpalladium chloride dimer (to ultimately give a monomer to catalyst ratio of 500/1) and 2 ml of dichloroethane. Another 10 ml glass vial is charged with 0.0344 g (0.1 mmol) of silver hexafluoroantimonate and 2 ml of dichloroethane. The catalyst solution is prepared by mixing the allylpalladium chloride dimer solution with silver hexaflurorantimonate solution inside a dry box. Immediate precipitation of silver chloride occurs and the precipitate is filtered out to obtain a clear yellow solution. The active yellow catalyst solution is added to the monomer solution via a syringe and the reaction mixture is allowed to stir for 20 hours at 60° C. Solids are precipitated from the solution, the solution is cooled, concentrated in a rotovap, and precipitated into hexane to obtain the polymer. The polymer is then dried in vacuum at room temperature.

EXAMPLE VIII

Synthesis of Preferred ArF Photoresist Resin

Synthesis of poly [2hydroxyethyl 5-norbornene-2carboxylate/t-butyl 5-norbornene-2-carboxylate/5-norbornene 2-carboxylic acid/maleic anhydride]

1 mole of maleic anhydride, 0.05–0.8 moles of 2-hydroxyethyl 5-norbornene-2-carboxylate, 0.5–0.95 moles of t-butyl 5-norbornene-2-carboxylate and 0.01 to 0.2 moles of 5-norbornene 2-carboxylic acid are dissolved in tetrahydrofuran or toluene. A radical reaction is executed at a temperature of about 60–70° C. for 4–24 hours under a nitrogen or argon atmosphere in the presence of 0.5–10 g of azobisisobutyronitrile (AIBN), as an initiator. The resin thus produced by this polymerization is precipitated in ethyl ether or hexane and dried to yield poly [2-hydroxyethyl 5-norbornene-2-carboxylate/t-butyl 5-norbornene-2-carboxylate/5-norbornene 2-carboxylic acid/maleic anhydride] resin of the following Formula X.

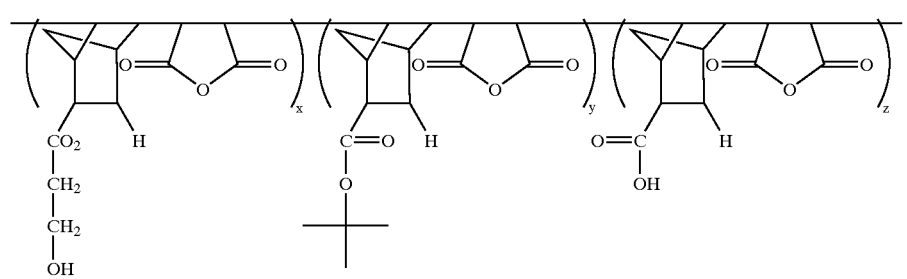

Formula X

EXAMPLE IX

Preparation of Photoresist Film and Formation of Pattern 10 g of poly [2-hydroxyethyl 5-norbornene-2-carboxylate/t-butyl 5-norbornene-2-carboxylate/5-norbornene 2-carboxylic acid/maleic anhydride] are dissolved in 40 g of 3-methoxymethyl propionate solvent and added with about 0.02.-1 g of triphenyl sulfonium triflate or dibutylnaphthyl sulfonium triflate or mixture of these two photoacid generators. After being well stirred, the mixture is passed through a 0.10 μm filter. This filtrate is coated on a wafer and patterned. When the coated layer is about 0.6 μm thick, a vertical L/S pattern is obtained with resolution of 0.14 μm.

As described hereinbefore, the photoresist prepared from the novel copolymer of the invention is superior in etch resistance and thermal resistance. In addition, it can be developed in a 2.38% TMAH solution. It also shows such good adhesiveness that 0.15 μm L/S patterns with satisfactory resolution and depth of focus can be obtained from a photoresist coat 0.7 μm thick. Consequently, the introduction of, for example, 2-hydroxyethyl 5-norbornene-2-carboxylate into the backbone of a resin allows for a synthesis of a photoresist excellent in adhesiveness.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A polymer comprising repeating units of the monomer 2-hydroxyethyl-5-norbornene-2-carboxylate of the following formula:

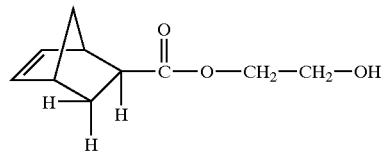

wherein said monomer is polymerized through the double bond in the bicycloalkene ring thereof.

2. A photoresist composition comprising a polymer of claim 1, a photoacid generator and an organic solvent.

3. A semiconductor device comprising a substrate and a film of the photoresist composition of claim 2 overlying said substrate.

4. A polymer consisting of repeating units of the monomer 2-hydroxyethyl-5-norbornene-2-carboxylate of the following formula:

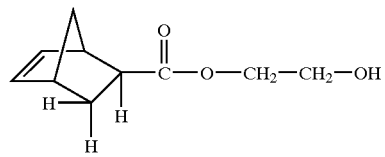

5. In a photoresist polymer having repeating units derived from bicycloalkene monomers in its backbone, the improvement which comprises 2-hydroxyethyl-5-norbornene-2-carboxylate of the following formula as at least one of said bicycloalkene monomers:

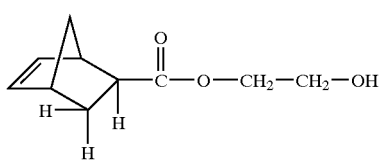

6. A method for improving the adhesiveness of a photoresist composition for coating on a substrate which comprises including in said composition a polymer having a backbone with repeating units derived from 2-hydroxyethyl-5-norbornene-2-carboxylate of the following formula:

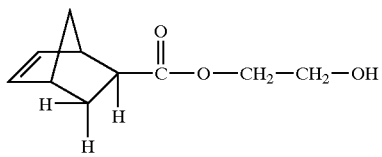

7. In a method of fabricating a semiconductor device wherein a layer of a composition containing a photoresist resin is coated on a substrate to form a film, a portion of said film is exposed using electromagnetic radiation, said film is developed to form a pattern on said substrate corresponding to the exposed portion of said film and said patterned substrate is used to form a semiconductor device, the improvement which comprises using a photoresist resin having repeating units derived from 2-hydroxyethyl-5-norbornene-2-carboxylate of the following formula:

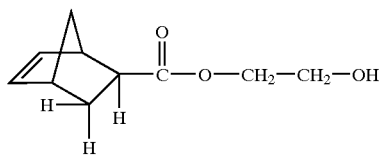

8. A method of preparing a polymer comprising the step of:

polymerizing 2-hydroxyethyl-5-norbornene-2-carboxylate of the following formula:

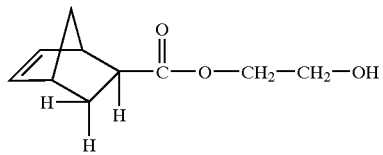

using a radical polymerization method.

9. A method of preparing a polymer in accordance with claim 8 wherein said radical polymerization method is performed by using a polymerization initiator selected from the group consisting of benzoylperoxide, 2,2'-azobisisobutyronitrile, acetylperoxide, lauryl peroxide and t-butylperacetate.

10. A method of preparing a polymer in accordance with claim 8, wherein said 2-hydroxyethyl-5-norbornene-2-carboxylate is synthesized from cyclopentadiene and 2-hydroxyethylacrylate.

* * * * *